United States Patent
Kimura et al.

(10) Patent No.: US 11,304,301 B2
(45) Date of Patent: Apr. 12, 2022

(54) ELECTRICAL JUNCTION BOX AND WIRE HARNESS

(71) Applicant: YAZAKI CORPORATION, Tokyo (JP)

(72) Inventors: Keisuke Kimura, Shizuoka (JP); Naoyuki Ikeda, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 317 days.

(21) Appl. No.: 16/551,667

(22) Filed: Aug. 26, 2019

(65) Prior Publication Data

US 2019/0380206 A1 Dec. 12, 2019

Related U.S. Application Data

(63) Continuation of application No. PCT/JP2017/012125, filed on Mar. 24, 2017.

(51) Int. Cl.
*H05K 1/00* (2006.01)
*H05K 1/18* (2006.01)
(Continued)

(52) U.S. Cl.
CPC .............. *H05K 1/18* (2013.01); *H01L 23/40* (2013.01); *H01L 25/072* (2013.01);
(Continued)

(58) Field of Classification Search
CPC .................. H05K 1/18; H05K 1/0263; H05K 2201/10166; H05K 2201/10272;
(Continued)

(56) References Cited

U.S. PATENT DOCUMENTS 5,478,244 A * 12/1995 Maue .................. B60R 16/0238
361/752
2003/0169007 A1 * 9/2003 Ashiya .................... H02P 29/02
318/471
(Continued)

FOREIGN PATENT DOCUMENTS

EP   1 119 228 A2   7/2001
EP   3 098 918 A1   11/2016
(Continued)

OTHER PUBLICATIONS

International Search Report and Written Opinion of the International Search Report for PCT/JP2017/012125 dated May 16, 2017.

*Primary Examiner* — Anatoly Vortman
*Assistant Examiner* — Zhengfu J Feng
(74) *Attorney, Agent, or Firm* — Kenealy Vaidya LLP

(57) ABSTRACT

An electrical junction box includes a conductive input busbar, a conductive output busbar electrically connectable to the input busbar, a semiconductor relay electrically connected to the input busbar and the output busbar and configured to switch a connected state and a disconnected state of the input busbar and the output busbar, a substrate having mounted thereon a control circuit configured to output a control signal for controlling the semiconductor relay, and a control terminal electrically connecting the control circuit and the semiconductor relay to each other to output the control signal to the semiconductor relay. The semiconductor relay is mounted on at least one of the input busbar and the output busbar. The input busbar, the output busbar, and the semiconductor relay are disposed away from the substrate.

6 Claims, 7 Drawing Sheets

(51) Int. Cl.
  *H01L 25/07* (2006.01)
  *H01L 25/11* (2006.01)
  *H01L 23/40* (2006.01)
  *B60R 16/023* (2006.01)
  *H05K 5/00* (2006.01)
  *H01R 31/06* (2006.01)

(52) U.S. Cl.
  CPC ........ *H01L 25/115* (2013.01); *B60R 16/0239* (2013.01); *H01R 31/065* (2013.01); *H05K 5/0052* (2013.01); *H05K 5/0069* (2013.01); *H05K 2201/10166* (2013.01); *H05K 2201/10272* (2013.01); *H05K 2201/10568* (2013.01); *H05K 2201/10901* (2013.01); *H05K 2201/10939* (2013.01)

(58) Field of Classification Search
  CPC .......... H05K 2201/10901; H05K 2201/10939; H05K 2201/10568; H05K 2201/10053; H05K 2201/10871; H05K 2201/2036; H05K 5/0052; H05K 5/0069; H01L 25/072; H01L 25/115; H01L 23/40; H01L 23/367; H01L 23/49562; H01L 23/49575; H01L 2224/48091; B60R 16/0239; B60R 16/0238; H01R 31/065; H01R 13/7038; H01H 9/00

USPC ........................................................ 361/714
  See application file for complete search history.

(56) References Cited

U.S. PATENT DOCUMENTS

| | | | |
|---|---|---|---|
| 2004/0043645 A1* | 3/2004 | Yamakawa | H05K 3/328 439/76.2 |
| 2004/0159455 A1* | 8/2004 | Onizuka | H05K 7/026 174/50 |
| 2008/0119066 A1 | 5/2008 | Shimizu et al. | |
| 2008/0259586 A1* | 10/2008 | Hosokawa | H05K 7/20854 361/813 |
| 2016/0104983 A1 | 4/2016 | Nakayama et al. | |
| 2016/0234928 A1* | 8/2016 | Nakamura | H05K 1/181 |
| 2017/0080883 A1* | 3/2017 | Yasunori | H02J 7/0063 |
| 2017/0318659 A1* | 11/2017 | Chin | H05K 7/209 |
| 2018/0370463 A1* | 12/2018 | Haraguchi | H05K 1/0203 |

FOREIGN PATENT DOCUMENTS

| | | |
|---|---|---|
| JP | 2008-153582 A | 7/2008 |
| JP | 2008-154440 A | 7/2008 |
| JP | 2011-130558 A | 6/2011 |
| JP | 2015-23591 A | 2/2015 |
| JP | 2016-12409 A | 1/2016 |
| JP | 2016-105678 A | 6/2016 |

* cited by examiner

ELECTRICAL JUNCTION BOX AND WIRE HARNESS

CROSS-REFERENCE TO RELATED APPLICATION(S)

This application is a continuation application of International Application PCT/JP2017/012125, filed on Mar. 24, 2017, and designating the U.S., the entire contents of which are incorporated herein by reference.

BACKGROUND OF THE INVENTION

1. Field of the Invention

The present invention relates to an electrical junction box and a wiring harness.

2. Description of the Related Art

In vehicles such as automobiles, an electrical junction box configured to distribute electric power from a power supply such as a battery into various electronic devices is mounted. As this type of electrical junction box, a technology including a semiconductor relay, a control circuit configured to control the semiconductor relay, and a busbar connected to an external device and configured to connect the external device, the semiconductor relay, and the control circuit is known (see, for example, Japanese Patent Application Laid-open No. 2008-153582). In this technology, the semiconductor relay includes a flat plate-shaped terminal portion made of metal and an IC chip mounted on the terminal portion so as to overlap with the terminal portion, in which the terminal portion is directly fixed to the busbar so as to overlap with the busbar. A substrate (printed wiring board) of the control circuit is mounted on the busbar so as to overlap with the rear surface of the busbar when seen from the semiconductor relay.

In this technology, the terminal portion of the semiconductor relay and the busbar overlap with each other, and the busbar and the substrate of the control circuit overlap with each other. Thus, when large current output is required, heat generated by the semiconductor relay may transfer to the busbar, and the heat may transfer from the busbar to the control circuit.

SUMMARY OF THE INVENTION

The present invention has been made in view of the above, and it is an object thereof to provide an electrical junction box and a wire harness that prevent heat generated by a semiconductor relay from transferring to a control circuit.

An electrical junction box according to one aspect of the present invention includes a conductive input busbar; a conductive output busbar electrically connectable to the input busbar; a semiconductor relay electrically connected to the input busbar and the output busbar and configured to switch a connected state and a disconnected state of the input busbar and the output busbar; a substrate having mounted thereon a control circuit configured to output a control signal for controlling the semiconductor relay; and a control terminal electrically connecting the control circuit and the semiconductor relay to each other to output the control signal to the semiconductor relay, wherein the semiconductor relay is mounted on at least one of the input busbar and the output busbar, and the input busbar, the output busbar, and the semiconductor relay are disposed away from the substrate.

According to another aspect of the present invention, it is preferable that the electrical junction box further includes an insulating portion covering connection portions of the semiconductor relay with the input busbar and the output busbar and a connection portion of the semiconductor relay with the control terminal by insulating material, wherein the insulating portion has a leg portion provided so as to protrude from a main body portion toward the substrate, and the main body portion is separated away from the substrate by the leg portion.

According to still another aspect of the present invention, it is preferable that the electrical junction box further includes a casing housing therein the input busbar, the output busbar, the semiconductor relay, the substrate, the control terminal, and the insulating portion; and a heatsink having a contact portion that contacts the insulating portion in the casing and an exposed portion that is formed integrally with the contact portion and exposed to outside of the casing, wherein the insulating portion has thermal conductivity higher than thermal conductivity of the input busbar, the output busbar, and the semiconductor relay.

According to still another aspect of the present invention, in the electrical junction box, it is preferable that the insulating portion is molded.

A wiring harness according to still another aspect of the present invention includes a power supply-side electric wire to be connected to a power supply side; a load-side electric wire to be connected to a load side; and an electrical junction box comprising: a conductive input busbar electrically connected to the power supply-side electric wire; a conductive output busbar electrically connectable to the input busbar and the load-side electric wire; a semiconductor relay electrically connected to the input busbar and the output busbar and configured to switch a connected state and a disconnected state of the input busbar and the output busbar; a substrate having mounted thereon a control circuit configured to output a control signal for controlling the semiconductor relay; and a control terminal electrically connecting the control circuit and the semiconductor relay to each other to output the control signal to the semiconductor relay, wherein the semiconductor relay is mounted on at least one of the input busbar and the output busbar, and the input busbar, the output busbar, and the semiconductor relay are disposed away from the substrate.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

An embodiment of the present invention is described in detail below with reference to the drawings. Note that the present invention is not limited by the embodiment. Components in the following embodiment include the ones that can be easily replaced by a person skilled in the art or the ones that are substantially the same.

Embodiment

Figure 1:
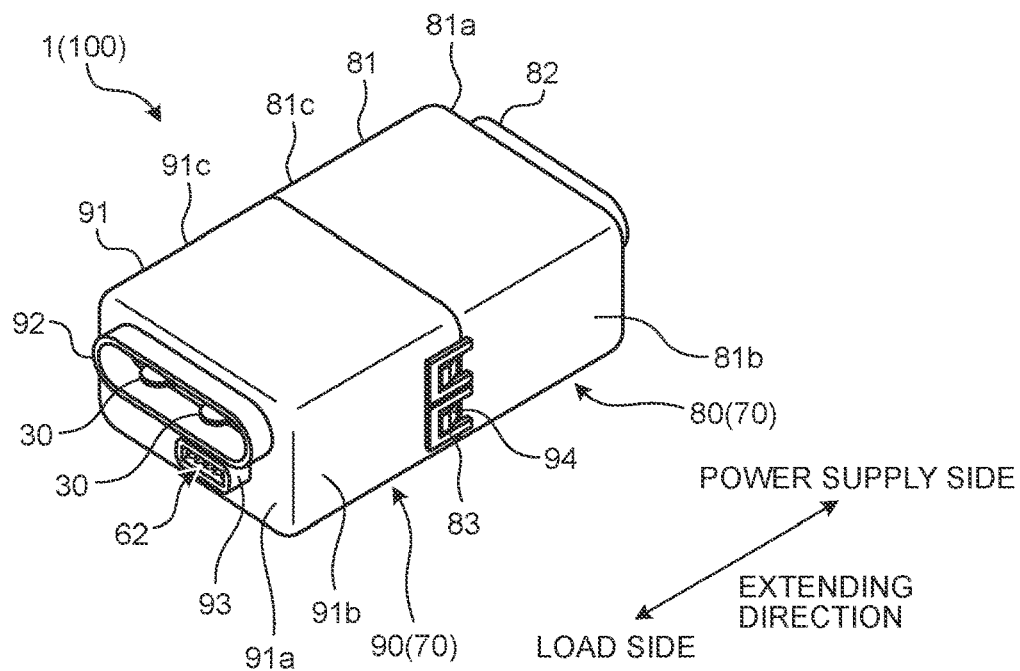
FIG. 1 is a perspective view illustrating a schematic configuration of an electrical junction box according to one embodiment of the present invention.
Figure 2:
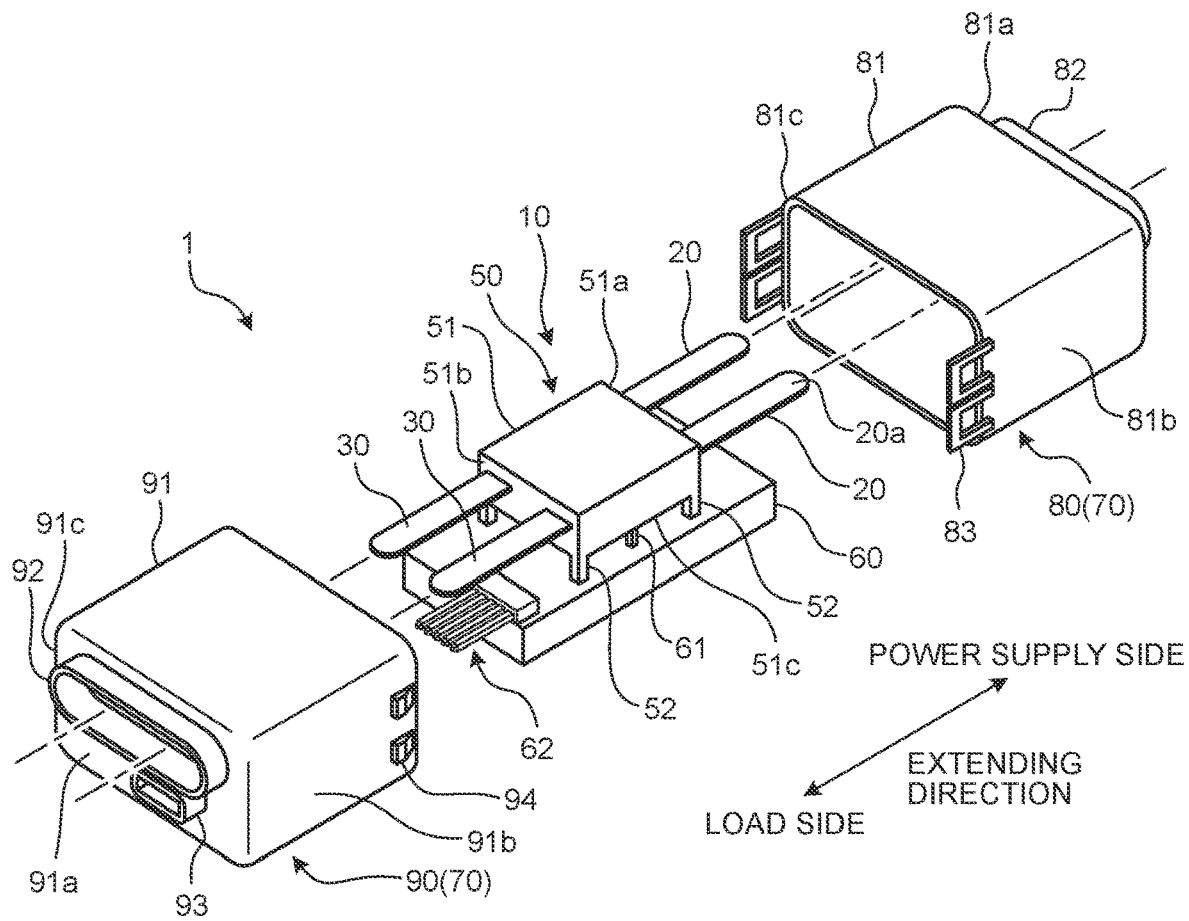
FIG. 2 is an exploded perspective view of the electrical junction box illustrated in FIG. 1.
Figure 3:
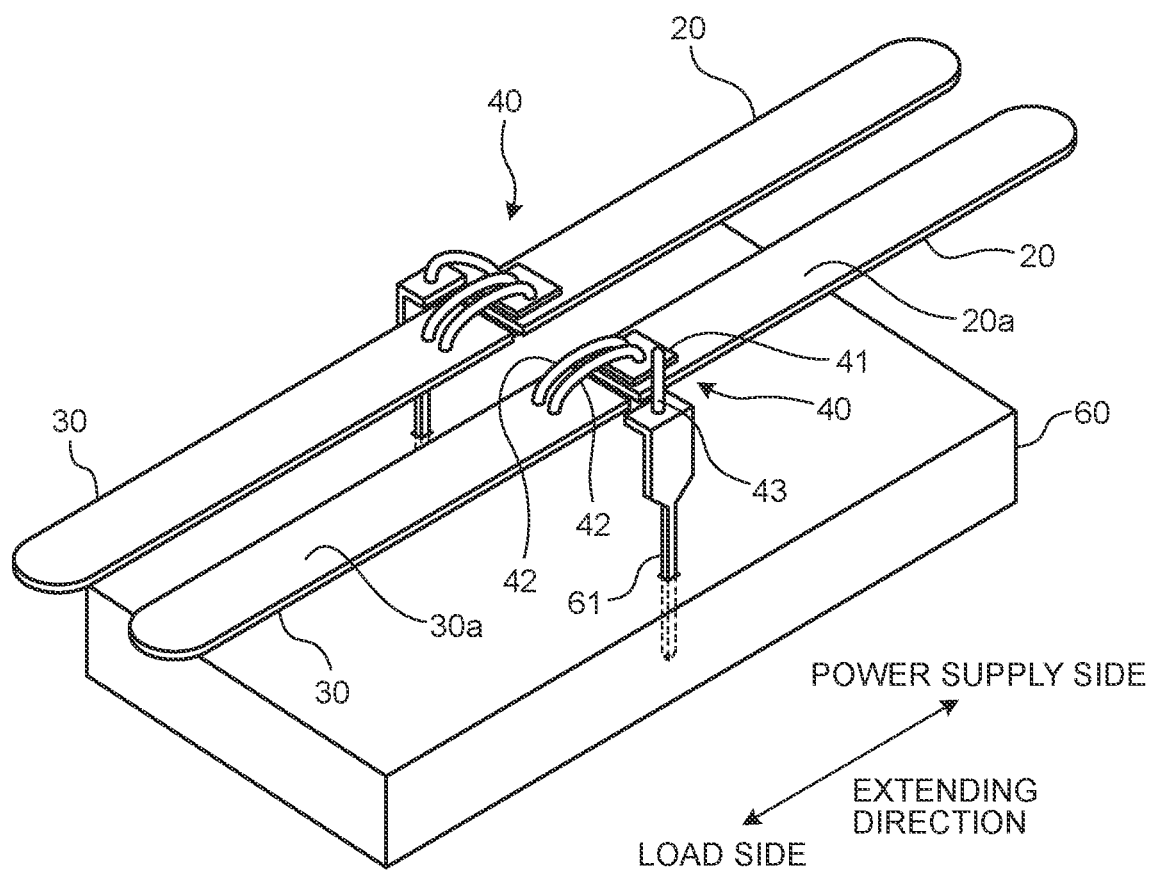
FIG. 3 is a perspective view illustrating a semiconductor relay, an input busbar plate, an output busbar plate, and a control terminal in the electrical junction box illustrated in FIG. 1.
Figure 4:
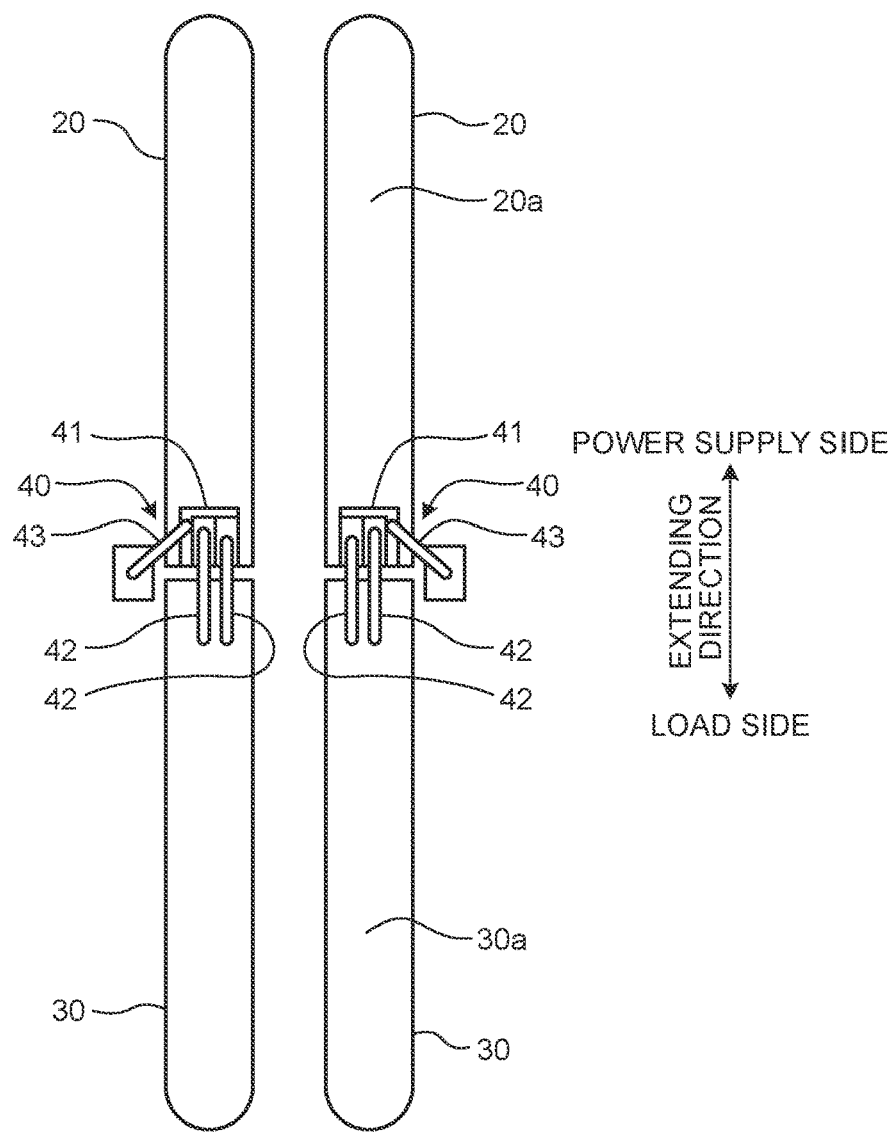
FIG. 4 is a plan view of the semiconductor relay, the input busbar plate, the output busbar plate, and the control terminal in the electrical junction box illustrated in FIG. 1.
Figure 5:
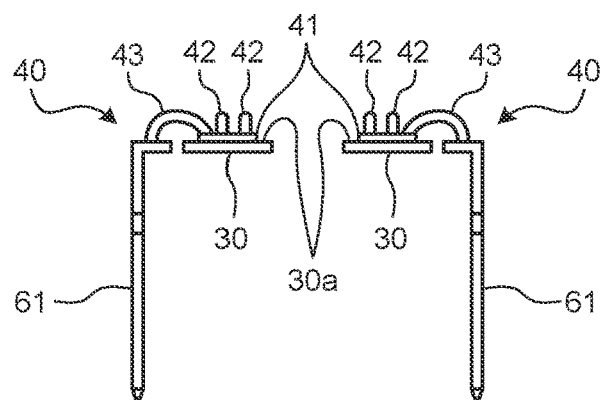
FIG. 5 is a side view of the semiconductor relay, the input busbar plate, the output busbar plate, and the control terminal in the electrical junction box illustrated in FIG. 1.
Figure 6:
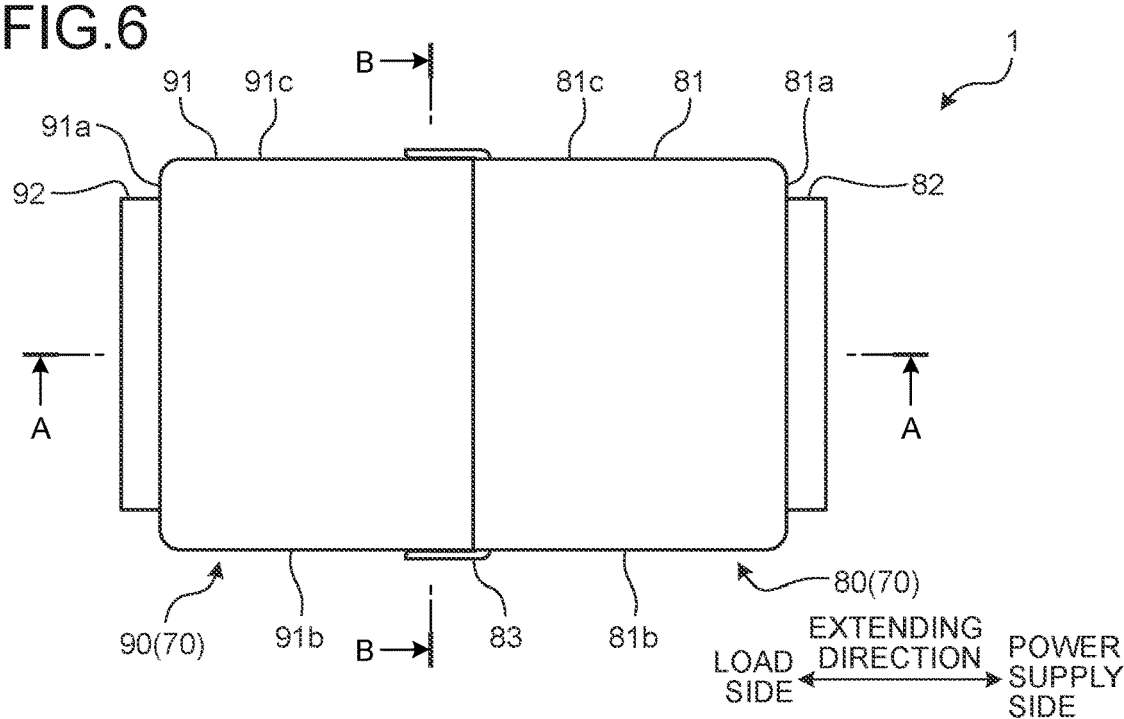
FIG. 6 is a plan view of the electrical junction box illustrated in FIG. 1.
Figure 7:
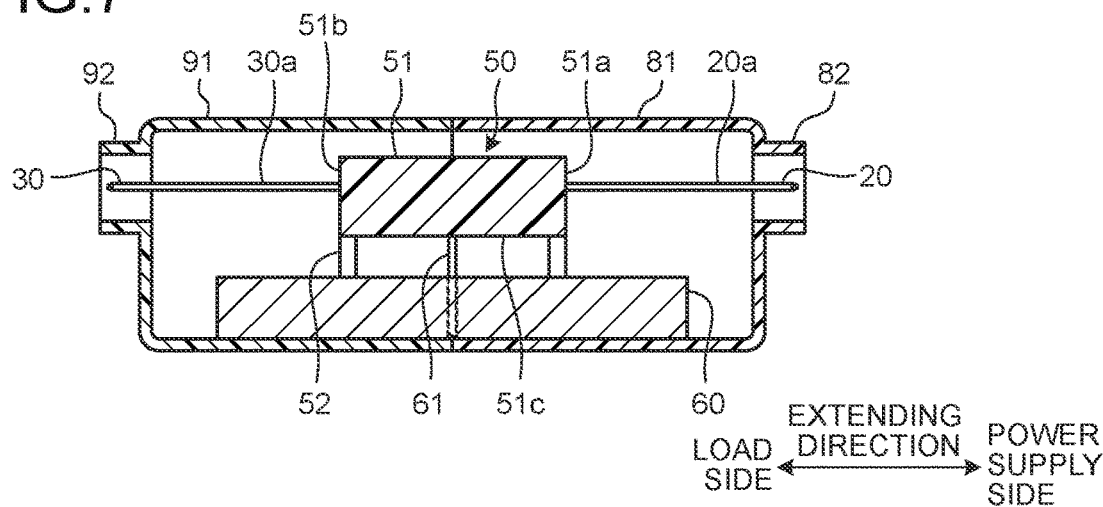
FIG. 7 is a cross-sectional view of the electrical junction box taken along the line A-A illustrated in FIG. 6.
Figure 8:
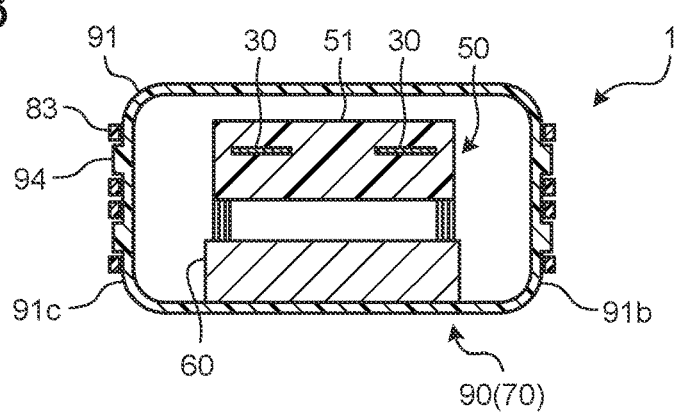
FIG. 8 is a cross-sectional view of the electrical junction box taken along the line B-B illustrated in FIG. 6.

FIG. 1 is a perspective view illustrating a schematic configuration of an electrical junction box according to one embodiment of the present invention. FIG. 2 is an exploded perspective view of the electrical junction box illustrated in FIG. 1. FIG. 3 is a perspective view illustrating a semiconductor relay, an input busbar plate, an output busbar plate, and a control terminal in the electrical junction box illustrated in FIG. 1. FIG. 4 is a plan view of the semiconductor relay, the input busbar plate, the output busbar plate, and the control terminal in the electrical junction box illustrated in FIG. 1. FIG. 5 is a side view of the semiconductor relay, the input busbar plate, the output busbar plate, and the control terminal in the electrical junction box illustrated in FIG. 1. FIG. 6 is a plan view of the electrical junction box illustrated in FIG. 1. FIG. 7 is a cross-sectional view of the electrical junction box taken along the line A-A illustrated in FIG. 6. FIG. 8 is a cross-sectional view of the electrical junction box taken along the line B-B illustrated in FIG. 6.

Note that, in the following description, a direction in which the input busbar plate and the output busbar plate extend is "extending direction". A side where the input busbar plate to be connected to a power supply-side device is disposed is "power supply side", and a side where the output busbar plate to be connected to a load-side device is disposed is "load side".

As illustrated in FIG. 1, an electrical junction box 1 according to the present embodiment is mounted on a vehicle such as an automobile. The electrical junction box 1 is connected between a power supply such as a battery and various kinds of electronic devices mounted in the vehicle. The electrical junction box 1 distributes electric power supplied from a power supply such as a battery into various kinds of electronic devices in the vehicle. Note that the electrical junction box 1 is sometimes called "junction box", "fuse box", or "relay box", but in the present embodiment, these are collectively called "electrical junction box".

The electrical junction box 1 exemplified in FIG. 1 and FIG. 2 includes a semiconductor module 10, a substrate 60, a control terminal 61, and a casing 70 described below.

The semiconductor module 10 includes an input busbar plate (input busbar) 20, an output busbar plate (output busbar) 30, a semiconductor relay 40, and a mold portion (insulating portion) 50 described below.

The input busbar plate 20 is formed from conductive metal. As illustrated in FIG. 2 to FIG. 5, the input busbar plate 20 is, for example, formed into a substantially rectangular plate shape by press. A power supply-side end portion of the input busbar plate 20 in the extending direction can be electrically connected to a connector of a power supply-side device. A load-side end portion of the input busbar plate 20 in the extending direction can be electrically connected to an output busbar plate 30 described later. The input busbar plate 20 is disposed such that the extending direction thereof matches the extending direction of the output busbar plate 30. The input busbar plate 20 is disposed such that one surface 20a faces upward and the one surface 20a is parallel to the horizontal direction. A semiconductor relay 40 described later is mounted on the input busbar plate 20. More specifically, a through hole (not shown) is formed in the input busbar plate 20. The through hole is a hole through which a lead wire or a terminal portion of an electronic component is inserted such that the lead wire or the terminal portion is electrically connected. The through hole passes through the input busbar plate 20 in the thickness direction. In the through hole, a drain terminal (not shown), a source terminal (not shown), and a gate terminal (not shown) of the semiconductor relay 40 are inserted.

The output busbar plate 30 is configured similarly to the input busbar plate 20. The output busbar plate 30 is disposed such that the extending direction thereof matches the extending direction of the input busbar plate 20. The input busbar plate 20 and the output busbar plate 30 are disposed away from each other in the extending direction. Specifically, the input busbar plate 20 and the output busbar plate 30 are disposed with a gap on the same straight line. The power supply side of the output busbar plate 30 in the extending direction can be electrically connected to the input busbar plate 20. The load side of the output busbar plate 30 in the extending direction can be electrically connected to a connector of a load-side device. The output busbar plate 30 is connected to a source terminal of the semiconductor relay 40 described later through a bonding wire 42. In this manner, the input busbar plate 20 and the output busbar plate 30 are electrically connected in series through the semiconductor relay 40.

The semiconductor relay 40 switches a connected state and a disconnected state of the input busbar plate 20 and the output busbar plate 30. The semiconductor relay 40 is mounted on the input busbar plate 20. In the present embodiment, the semiconductor relay 40 is placed on one surface 20a of the input busbar plate 20. Note that, the semiconductor relay 40 may be placed on the rear surface of the input busbar plate 20. More specifically, the semiconductor relay 40 has a main body portion 41 in which an electronic element is built, a drain terminal, a source terminal, and a gate terminal. The main body portion 41 is formed into a rectangular shape. The drain terminal, the source terminal, and the gate terminal are disposed in parallel to one another. The drain terminal, the source terminal, and the gate terminal are inserted in the through hole in the input busbar plate 20, and the semiconductor relay 40 is mounted on one surface 20a. The drain terminal is connected to the input busbar plate 20 by soldering. The source terminal is connected to the input busbar plate 20 by soldering. The source terminal is connected to the output busbar plate 30 through a bonding wire 42. The gate terminal is connected to the input busbar plate 20 by soldering. The gate terminal is connected to a switching control terminal (hereinafter simply referred to as "control terminal") 61 described later through a bonding wire 43. Each of the soldering, the bonding wires 42, 43, and the terminals (drain, source, and gate) of the semiconductor relay 40 can be referred to as a connection portion. In this manner, the semiconductor relay 40 is electrically connected to the input busbar plate 20, the output busbar plate 30, and the substrate 60. The semiconductor relay 40 is controlled by a control circuit described later.

One or more combinations of the input busbar plate 20, the output busbar plate 30, and the semiconductor relay 40 configured as describe above and the control terminal 61 described later are provided. In the present embodiment, two of these combinations are provided. Two such input busbar plates 20 are disposed in parallel. Specifically, two pairs of the input busbar plates 20 and the output busbar plates 30 are disposed in parallel on the same horizontal plane.

As illustrated in FIG. 2, the mold portion 50 covers the two combinations integrally by synthetic resin material. The exemplified mold portion 50 covers the semiconductor relay 40, connection portions of the semiconductor relay 40 with the input busbar plate 20 and the output busbar plate 30, and a connection portion of the semiconductor relay 40 with the control terminal 61 of the substrate 60 described later. In the present embodiment, the synthetic resin material is material having electrical insulating property and having thermal conductivity higher than thermal conductivity of the input busbar plate 20, the output busbar plate 30, and the semiconductor relay 40. The mold portion 50 has a main body portion 51 and leg portions 52. The main body portion 51 houses therein the semiconductor relay 40, the connection portions of the semiconductor relay 40 with the input busbar plate 20 and the output busbar plate 30, and the connection portion of the semiconductor relay 40 with the control terminal 61 of the substrate 60 described later. The main body portion 51 is formed into a rectangular parallelepiped. More specifically, the main body portion 51 has a rectangular bottom wall portion 51c, four wall portions, such as wall portions 51a and 51b, provided upward from the sides of the bottom wall portion 51c, and an upper wall portion disposed so as to be opposed to the bottom wall portion 51c. The wall portion 51a is a surface orthogonal to the extending direction, and is disposed on the power supply side. The wall portion 51b is disposed so as to be opposed to the wall portion 51a. The bottom wall portion 51c is disposed so as to be opposed to the substrate 60. The input busbar plate 20 passes through the wall portion 51a. The output busbar plate 30 passes through the wall portion 51b opposed to the wall portion 51a. The leg portions 52 fix the mold portion 50 onto the substrate 60. The leg portions 52 are formed so as to protrude from the main body portion 51 toward the substrate 60. Four leg portions 52 are disposed under the main body portion 51. The leg portions 52 are inserted to through holes (not shown) formed in the substrate 60 described later and fixed by soldering. More specifically, the leg portions 52 are fixed to the substrate 60 such that the bottom wall portion 51c is separated away from the substrate 60. In this manner, the main body portion 51 is fixed so as to be separated away from the substrate 60 by the leg portions 52. The distance by which the main body portion 51 is separated away from the substrate 60 is, for example, a distance that is large enough for the control circuit of the substrate 60 not to be affected when the semiconductor relay 40 generates heat to increase the temperature thereof and the temperature of the substrate 60 increases.

The substrate 60 is what is called "printed circuit board (PCB)". In the substrate 60, for example, a wiring pattern (print pattern) made of conductive material such as copper is printed on a surface (mounting surface) of an insulating substrate made of insulating material such as epoxy resin, glass epoxy resin, paper epoxy resin, or ceramic. In the substrate 60, a through hole is formed at a part of the insulating substrate where the wiring pattern is formed. The through hole is a hole through which a lead wire or a terminal portion of an electronic component is inserted such that the lead wire or the terminal portion is electrically connected to the wiring pattern. The through hole passes through the insulating substrate and the wiring pattern in the thickness direction. The substrate 60 includes a control circuit (not shown) and a signal terminal 62. The control circuit outputs a control signal for controlling the semiconductor relay 40. The control circuit is mounted as a wiring pattern. The signal terminal 62 outputs a control signal to a load-side device. The signal terminal 62 is formed integrally with the substrate 60. In the present embodiment, five signal terminals 62 are disposed in parallel to one another.

The control terminal 61 is electrically connected to the control circuit of the substrate 60 and the semiconductor relay 40, and outputs a control signal to the semiconductor relay 40. More specifically, a lower part of the control terminal 61 is inserted to a through hole in the substrate 60 and electrically connected to a wiring pattern. The control terminal 61 is electrically connected to the semiconductor relay 40 through the bonding wire 43. A lower part of the control terminal 61 has a pin shape, and the contact area with the substrate 60 is sufficiently smaller than the area of the substrate 60.

As illustrated in FIG. 2 and FIG. 6 to FIG. 8, in the casing 70, the semiconductor module 10 and the substrate 60 are fitted. The casing 70 is formed from insulating synthetic resin material. The casing 70 is formed by engaging the box members 80 and 90.

In the box member 80, the power supply side of the semiconductor module 10 and the substrate 60 is housed. The box member 80 has a main body portion 81, a connector fitting portion 82, and portions to be engaged 83. The main body portion 81 is formed into a box shape in which the load side in the extending direction is opened. The main body portion 81 has a rectangular cross-section when seen from the extending direction. More specifically, the main body portion 81 has a rectangular wall portion 81a and four wall portions, such as wall portions 81b and 81c, provided upright in the extending direction from the sides of the wall portion 81a. The wall portion 81a is a surface orthogonal to the extending direction, and is disposed on the power supply side. The wall portion 81b and the wall portion 81c are disposed so as to be opposed to each other. The connector fitting portion 82 is provided at an upper part of the wall portion 81a in the vertical direction. The connector fitting portion 82 is formed into a cylindrical shape having an elliptical or ovaltrack-shaped cross-section when seen from the extending direction. The connector fitting portion 82 communicates to the inside of the main body portion 81. The connector fitting portion 82 is fitted to a connector mounted on a terminal of an electric wire on a power supply-side device side. In the connector fitting portion 82, a power supply-side end portion of the input busbar plate 20 is located. In the connector fitting portion 82, the input busbar plate 20 can be connected to a connector mounted on a terminal of an electric wire on a power supply-side device side. The portions to be engaged 83 are disposed on the wall portions 81b and 81c on the load side in the extending direction. The portions to be engaged 83 are formed into a frame shape that can house engaging portions 94 described later therein. The portions to be engaged 83 are engaged with the engaging portions 94 while housing the engaging portions 94 therein.

In the box member 90, the load side of the semiconductor module 10 and the substrate 60 is housed. The box member 90 has a main body portion 91, a first connector fitting portion 92, a second connector fitting portion 93, and the engaging portions 94. The main body portion 91 is formed into a box shape in which the power supply side in the extending direction is opened. The main body portion 91 has a rectangular cross-section when seen from the extending direction. More specifically, the main body portion 91 has a rectangular wall portion 91a and four wall portions, such as wall portions 91b and 91c, provided upright in the extending direction from the sides of the wall portion 91a. The wall portion 91a is a surface orthogonal to the extending direction, and is disposed on the load side. The wall portion 91b and the wall portion 91c are disposed so as to be opposed to each other. The first connector fitting portion 92 is provided at an upper part of the wall portion 91a in the vertical direction. The first connector fitting portion 92 is formed into a cylindrical shape having an elliptical or ovaltrack-shaped cross-section when seen from the extending direction. The first connector fitting portion 92 communicates to the inside of the main body portion 91. The first connector fitting portion 92 is fitted to a connector mounted on a terminal of an electric wire on a load-side device side. In the first connector fitting portion 92, a load-side end portion of the output busbar plate 30 is located. In the first connector fitting portion 92, the output busbar plate 30 can be connected to a connector mounted on a terminal of an electric wire on a load-side device side. The second connector fitting portion 93 is provided at a lower part of the wall portion 91a in the vertical direction. The second connector fitting portion 93 is formed into a cylindrical shape having a rectangular cross-section when seen from the extending direction. The second connector fitting portion 93 communicates to the inside of the main body portion 91. The second connector fitting portion 93 is fitted to a signal connector mounted on a terminal of an electric wire on a load-side device side. In the second connector fitting portion 93, the signal terminal 62 is located. In the second connector fitting portion 93, the signal terminal 62 can be connected to a signal connector mounted on a terminal of an electric wire on a load-side device side. The engaging portions 94 are disposed on the wall portions 91b and 91c on the power supply side in the extending direction. The engaging portions 94 are formed into a projecting shape that protrudes from the wall portions 91b and 91c. The engaging portions 94 are engaged with the portions to be engaged 83 while being housed therein. When the engaging portions 94 are housed in the portions to be engaged 83 and engaged therewith, the box members 80 and 90 are engaged with each other to form the casing 70.

In the casing 70 configured as described above, the distance between the box members 80 and 90 is decreased in the state in which the openings in the box members 80 and 90 are opposed to each other and the semiconductor module 10 and the substrate 60 are sandwiched therebetween, and the engaging portions 94 are housed in the portions to be engaged 83 and engaged with the portions to be engaged 83, so that the semiconductor module 10 and the substrate 60 are housed in the casing 70.

In the electrical junction box 1 described above, the mold portion 50 covers the semiconductor relay 40, the connection portions of the semiconductor relay 40 with the input busbar plate 20 and the output busbar plate 30, and the connection portion of the semiconductor relay 40 with the control terminal 61 of the substrate 60 integrally by synthetic resin material. The mold portion 50 is fixed to the substrate 60 such that the leg portions 52 formed so as to protrude from the main body portion 51 toward the substrate 60 separate the main body portion 51 away from the substrate 60. In this manner, in the electrical junction box 1, the main body portion 51 having the semiconductor relay 40 housed therein is separated away from the substrate 60, and hence even when the electrical junction box 1 is used for an electric circuit through which large current flows and the semiconductor relay 40 generates heat to increase the temperature thereof, the transfer of the heat to the control circuit of the substrate 60 can be suppressed. The input busbar plate 20 on which the semiconductor relay 40 is mounted is connected to the substrate 60 through the control terminal 61 and the bonding wire 43. Furthermore, the control terminal 61 has a pin shape, and the contact area with the substrate 60 is sufficiently smaller than the area of the substrate 60. Consequently, the electrical junction box 1 can more reliably prevent heat generated by the semiconductor relay 40 from being transferred to the control circuit.

First Modification

Figure 9:
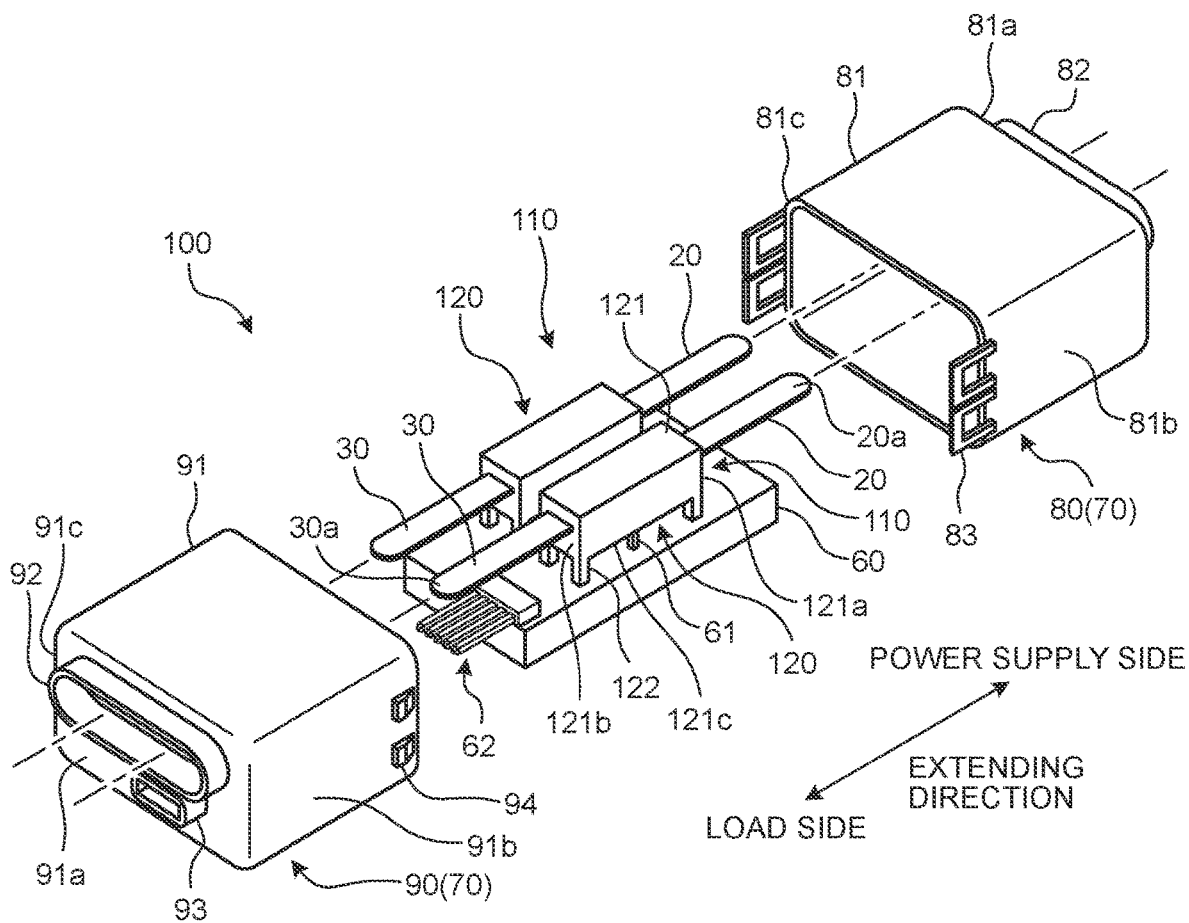
FIG. 9 is an exploded perspective view illustrating a schematic configuration of an electrical junction box according to a first modification of the present invention.
Figure 10:
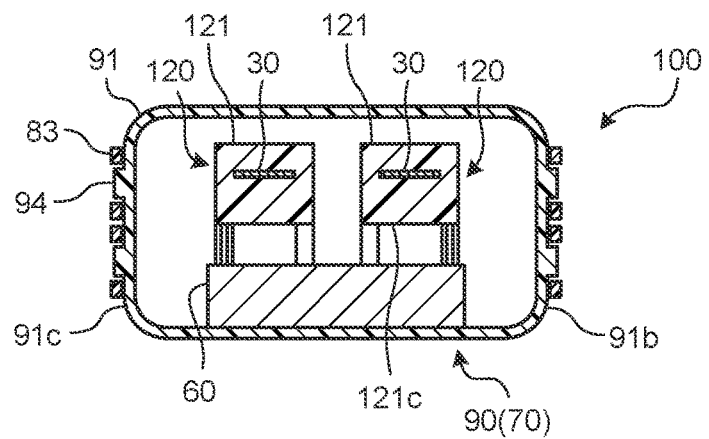
FIG. 10 is a cross-sectional view of the electrical junction box illustrated in FIG. 9.

Next, an electrical junction box according to a first modification of the embodiment is described in detail with reference to the drawings. FIG. 9 is an exploded perspective view illustrating a schematic configuration of the electrical junction box according to the first modification. FIG. 10 is a cross-sectional view of the electrical junction box illustrated in FIG. 9. Note that, in FIG. 9 and FIG. 10, the same portions as in the embodiment are denoted by the same reference symbols, and descriptions thereof are omitted.

An electrical junction box 100 according to the first modification of the embodiment is different from the electrical junction box 1 according to the embodiment in that two semiconductor modules 110 are mounted on the substrate 60. Note that, in the first modification, an input busbar plate 20 is configured similarly to the input busbar plate 20 in the embodiment. The output busbar plate 30 is configured similarly to the output busbar plate 30 in the embodiment. A semiconductor relay (not shown) is configured similarly to the semiconductor relay 40 in the embodiment. A substrate 60 is configured similarly to the substrate 60 in the embodiment. A casing 70 is configured similarly to the casing 70 in the embodiment. A box member 80 is configured similarly to the box member 80 in the embodiment. A box member 90 is configured similarly to the box member 90 in the embodiment.

The semiconductor module 110 includes an input busbar plate 20, an output busbar plate 30, a semiconductor relay, and a mold portion 120 described later. Two semiconductor modules 110 are mounted on the substrate 60.

The mold portion 120 covers one combination of the semiconductor relay, connection portions of the semiconductor relay with a pair of the input busbar plate 20 and the output busbar plate 30, and a connection portion of the semiconductor relay with the control terminal 61 of the substrate 60 integrally by synthetic resin material. In other words, two mold portions 120 are provided. The mold portion 120 has a main body portion 121 and leg portions 122. The main body portion 121 houses therein the semiconductor relay, the connection portions of the semiconductor relay with a pair of the input busbar plate 20 and the output busbar plate 30, and the connection portion of the semiconductor relay with the control terminal 61 of the substrate 60. The main body portion 121 has a rectangular bottom wall portion 121c, four wall portions, such as wall portions 121a and 121b, provided upward from the sides of the bottom wall portion 121c, and an upper wall portion disposed so as to be opposed to the bottom wall portion 121c. The wall portion 121a is a surface orthogonal to the extending direction, and is disposed on the power supply side. The wall portion 121b is disposed so as to be opposed to the wall portion 121a. The bottom wall portion 121c is disposed so as to be opposed to the substrate 60. One input busbar plate 20 passes through the wall portion 121a. One output busbar plate 30 passes through the wall portion 121b opposed to the wall portion 121a. The leg portions 122 fix the mold portion 120 onto the substrate 60. The leg portions 122 are formed so as to protrude from the main body portion 121 toward the substrate 60. In the state in which the leg portions 122 are fixed to the substrate 60, the bottom wall portion 121c is separated away from the substrate 60. In this manner, the main body portion 121 is fixed so as to be separated away from the substrate 60 by the leg portions 122.

Also in the first modification, similarly to the embodiment, in the electrical junction box 100, the mold portion 120 covers the semiconductor relay, the connection portions of the semiconductor relay with the input busbar plate 20 and the output busbar plate 30, and the connection portion of the semiconductor relay with the control terminal 61 of the substrate 60 integrally by synthetic resin material. The mold portion 120 is fixed to the substrate 60 such that the leg portions 122 formed so as to protrude from the main body portion 121 toward the substrate 60 separate the main body portion 121 away from the substrate 60. In this manner, in the electrical junction box 100, the main body portion 121 having the semiconductor relay housed therein is separated away from the substrate 60, and hence even when the electrical junction box 100 is used for an electric circuit through which large current flows and the semiconductor relay generates heat to increase the temperature thereof, the transfer of the heat to the control circuit of the substrate 60 can be suppressed. Consequently, the electrical junction box 100 can prevent heat generated by the semiconductor relay from being transferred to the control circuit.

Second Modification

Figure 11:
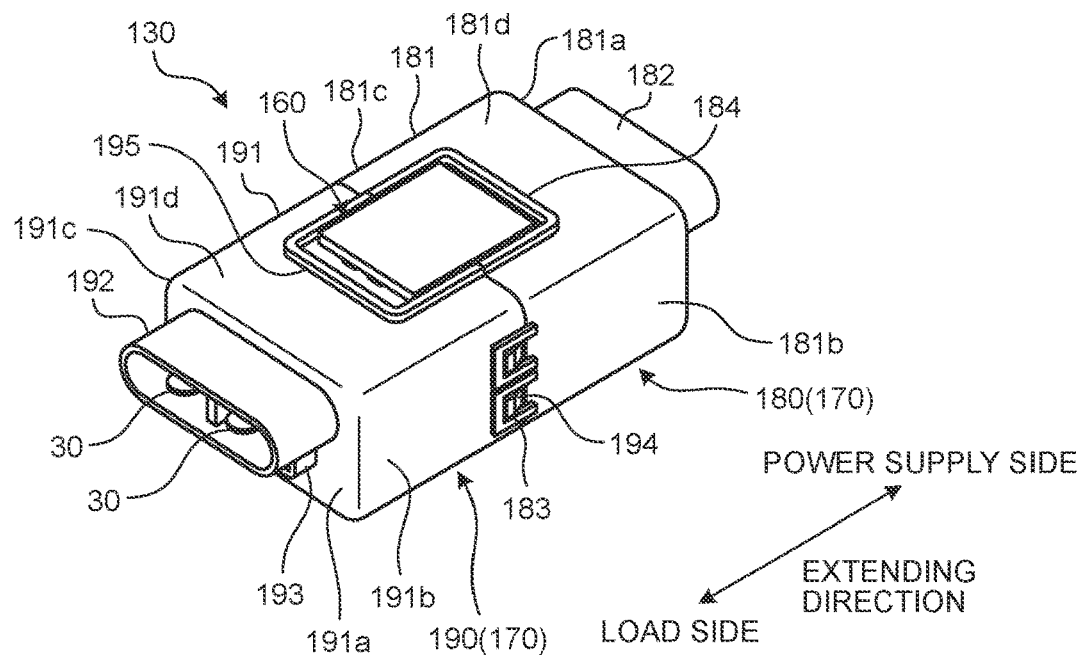
FIG. 11 is an exploded perspective view illustrating a schematic configuration of an electrical junction box according to a second modification of the present invention.
Figure 12:
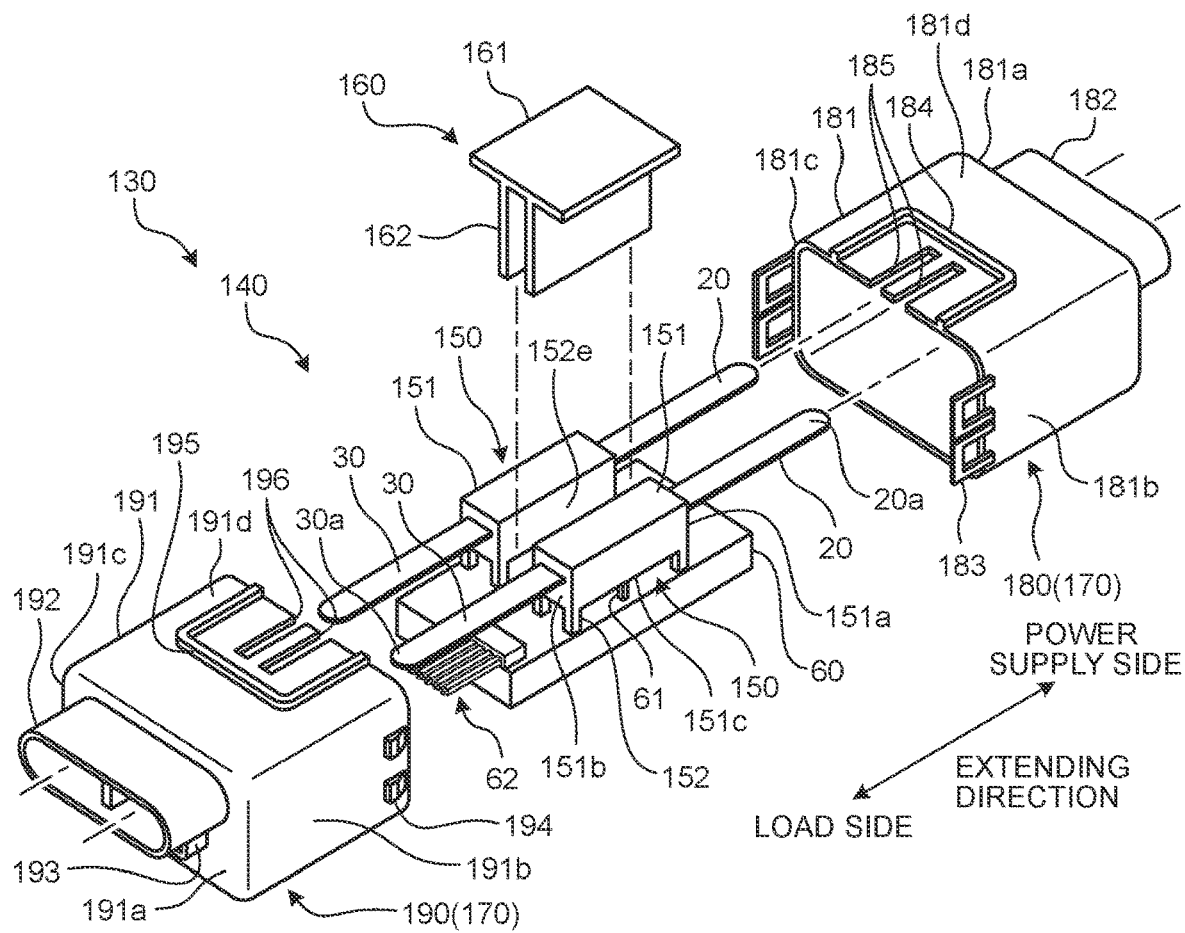
FIG. 12 is an exploded perspective view of the electrical junction box illustrated in FIG. 11.
Figure 13:
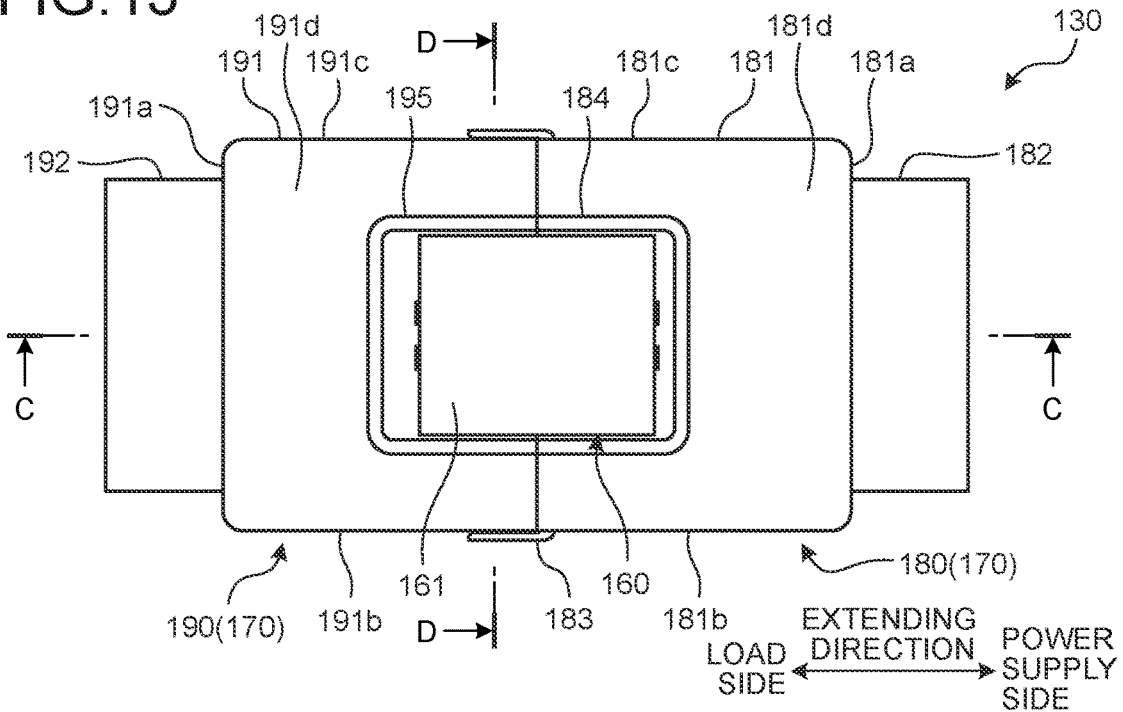
FIG. 13 is a plan view of the electrical junction box illustrated in FIG. 11.
Figure 14:
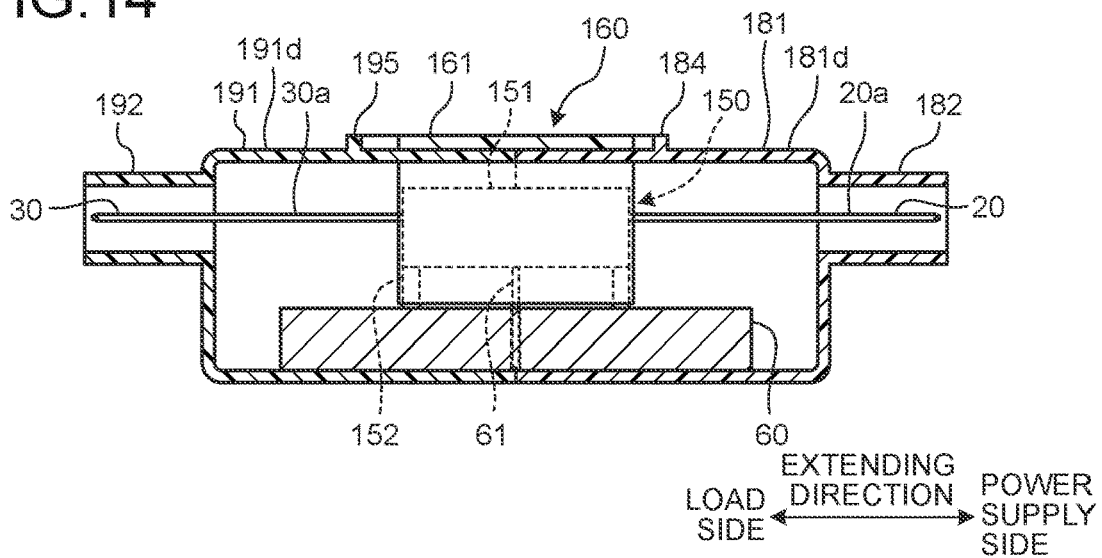
FIG. 14 is a cross-sectional view of the electrical junction box taken along the line C-C illustrated in FIG. 13.
Figure 15:
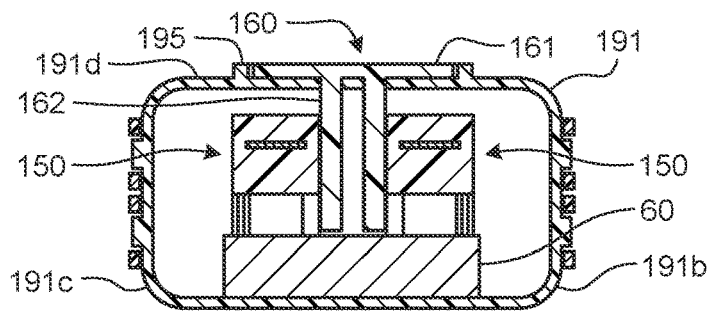
FIG. 15 is a cross-sectional view of the electrical junction box taken along the line D-D illustrated in FIG. 13.

Next, an electrical junction box according to a second modification of the embodiment is described in detail with reference to the drawings. FIG. 11 is an exploded perspective view illustrating a schematic configuration of the electrical junction box according to the second modification. FIG. 12 is an exploded perspective view of the electrical junction box illustrated in FIG. 11. FIG. 13 is a plan view of the electrical junction box illustrated in FIG. 11. FIG. 14 is a cross-sectional view of the electrical junction box taken along the line C-C illustrated in FIG. 13. FIG. 15 is a cross-sectional view of the electrical junction box taken along the line D-D illustrated in FIG. 13. Note that, in FIG. 11 to FIG. 15, the same portions as in the embodiment are denoted by the same reference symbols, and descriptions thereof are omitted.

As illustrated in FIG. 12, in an electrical junction box 130 according to the second modification of the embodiment, similarly to the electrical junction box 100 according to the first modification of the embodiment, two semiconductor modules 150 are mounted on a substrate 60. The electrical junction box 130 includes a heatsink 160, which is different from the electrical junction box 1 according to the embodiment and the electrical junction box 100 according to the first modification of the embodiment. Note that, in the second modification, an input busbar plate 20 is configured similarly to the input busbar plate 20 in the embodiment. An output busbar plate 30 is configured similarly to the output busbar plate 30 in the embodiment. A semiconductor relay (not shown) is configured similarly to the semiconductor relay 40 in the embodiment. The substrate 60 is configured similarly to the substrate 60 in the embodiment. The semiconductor module 150 is configured similarly to the semiconductor module 110 in the first modification.

The mold portion 150 covers one combination of the semiconductor relay, connection portions of the semiconductor relay with a pair of the input busbar plate 20 and the output busbar plate 30, and a connection portion of the semiconductor relay with a control terminal (not shown) of the substrate 60 by synthetic resin material. In other words, two mold portions 150 are provided. The mold portion 150 has a main body portion 151 and leg portions 152. The main body portion 151 houses therein the semiconductor relay, the connection portions of the semiconductor relay with a pair of the input busbar plate 20 and the output busbar plate 30, and the connection portion of the semiconductor relay with the control terminal of the substrate 60. The main body portion 151 has a rectangular bottom wall portion 151c, four wall portions, such as wall portions 151a and 151b, provided upward from the sides of the bottom wall portion 151c, and an upper wall portion disposed so as to be opposed to the bottom wall portion 151c. The wall portion 151a is a surface orthogonal to the extending direction, and is disposed on the power supply side. The wall portion 151b is disposed so as to be opposed to the wall portion 151a. The bottom wall portion 151c is disposed so as to be opposed to the substrate 60. One input busbar plate 20 passes through the wall portion 151a. One output busbar plate 30 passes through the wall portion 151b opposed to the wall portion 151a. The leg portions 152 fix the mold portion 150 onto the substrate 60. The leg portions 152 are formed so as to protrude from the main body portion 151 toward the substrate 60. The leg portions 152 are fixed to the substrate 60 such that the bottom wall portion 151c is separated away from the substrate 60. In this manner, the main body portion 151 is fixed so as to be separated away from the substrate 60 by the leg portions 152.

The heatsink 160 releases heat of the mold portion 150 to the outside of the electrical junction box 130. The heatsink 160 is made of material having thermal conductivity higher than thermal conductivity of the input busbar plate 20, the output busbar plate 30, and the semiconductor relay. The heatsink 160 has an exposed portion 161 and contact portions 162. The exposed portion 161 is formed into a flat plate shape. The exposed portion 161 is disposed so as to be exposed to the outside of the casing 170. The contact portions 162 are provided to extend from one surface of the exposed portion 161 downward in the vertical direction. The contact portions 162 are formed into a flat plate shape. The two contact portions 162 are disposed in parallel. Each contact portion 162 contacts a wall portion 152*e* of the mold portion 150 in the casing 170.

In the casing 170, the semiconductor module 140 and the substrate 60 are fitted. The casing 170 is formed by engaging box members 180 and 190 with each other.

In the box member 180, the power supply side of the semiconductor module 140 and the substrate 60 is housed. The box member 180 has a main body portion 181, a connector fitting portion 182, a portion to be engaged 183, a holding portion 184, and slits 185. The main body portion 181 is configured similarly to the main body portion 81 in the embodiment. More specifically, the main body portion 181 has a rectangular wall portion 181*a* and four wall portions, such as wall portions 181*b*, 181*c*, and 181*d*, provided upright in the extending direction from the sides of the wall portions 181*a*. The wall portion 181*a* is a surface orthogonal to the extending direction, and is disposed on the power supply side. The wall portion 181*b* and the wall portion 181*c* are disposed so as to be opposed to each other. The wall portion 181*d* is disposed on the upper side in the vertical direction so as to be opposed to a surface opposed to the substrate 60. The connector fitting portion 182 is configured similarly to the connector fitting portion 82 in the embodiment. The portion to be engaged 183 is configured similarly to the portion to be engaged 83 in the embodiment. The holding portion 184 forms a rectangular frame together with a holding portion 195 described later, and houses the exposed portion 161 of the heatsink 160 in the rectangular frame. The holding portion 184 is provided to protrude from the wall portion 181*d*. The holding portion 184 is formed into a C-shaped frame in which the load side in the extending direction is opened. The slits 185 are for inserting the contact portions 162 of the heatsink 160 therethrough. The slits 185 form linear grooves together with slits 196 described later, and are for inserting the contact portions 162 of the heatsink 160 therethrough. The slits 185 are disposed on the inner side of the holding portion 184. The slits 185 pass through the wall portion 181*d* in the thickness direction. The slits 185 are formed into a linear shape extending in the extending direction. Two slits 185 are formed in parallel.

In the box member 190, the load side of the semiconductor module 140 and the substrate 60 is housed. The box member 190 has a main body portion 191, a first connector fitting portion 192, a second connector fitting portion 193, an engaging portion 194, the holding portion 195, and the slits 196. The main body portion 191 is configured similarly to the main body portion 91 in the embodiment. More specifically, the main body portion 191 has a rectangular wall portion 191*a* and four wall portions, such as wall portions 191*b*, 191*c*, and 191*d*, provided upright in the extending direction from the sides of the wall portion 191*a*. The wall portion 191*a* is a surface orthogonal to the extending direction, and is disposed on the load side. The wall portion 191*b* and the wall portion 191*c* are disposed so as to be opposed to each other. The wall portion 191*d* is disposed on the upper side in the vertical direction so as to be opposed to a surface opposed to the substrate 60. The first connector fitting portion 192 is configured similarly to the first connector fitting portion 92 in the embodiment. The second connector fitting portion 193 is configured similarly to the second connector fitting portion 93 in the embodiment. The engaging portion 194 is configured similarly to the engaging portion 94 in the embodiment. The holding portion 195 is provided to protrude from the wall portion 191*d*. The holding portion 195 is formed into a C-shaped frame in which the power supply side in the extending direction is opened. The holding portions 184 and 195 form a rectangular frame in the state in which the box members 180 and 190 are engaged. The slits 196 are for inserting the contact portions 162 of the heatsink 160 therethrough. The slits 196 pass through the wall portion 191*d* in the thickness direction. The slits 196 are formed into a linear shape extending in the extending direction. Two slits 196 are formed in parallel. Through the slits 196, the contact portions 162 of the heatsink 160 are inserted. The slits 185 and 196 become continuous to be linear in the state in which the box members 180 and 190 are engaged.

In the casing 170 configured as described above, the distance between the box members 180 and 190 is decreased in the state in which the openings in the box members 180 and 190 are opposed to each other and the semiconductor module 140 and the substrate 60 are sandwiched therebetween, and the engaging portions 194 are housed in the portions to be engaged 183 and engaged with the portions to be engaged 183, so that the semiconductor module 140 and the substrate 60 are housed in the casing 170. The exposed portion 161 of the heatsink 160 is exposed to the outside of the casing 170 through the slits 185 and 196. In this case, the exposed portion 161 of the heatsink 160 is housed in a frame formed by the holding portions 184 and 195.

When the semiconductor relay generates heat, the temperature of the mold portion 150 in the electrical junction box 130 increases. Heat of the mold portion 150 is transferred from the contact portion 162 to the exposed portion 161 of the heatsink 160. The exposed portion 161 releases the heat to air outside the electrical junction box 130.

Also in the second modification, similarly to the embodiment and the first modification, in the electrical junction box 130, the mold portion 150 covers the semiconductor relay, the connection portions of the semiconductor relay with the input busbar plate 20 and the output busbar plate 30, and the connection portion of the semiconductor relay with the control terminal of the substrate 60 integrally by synthetic resin material. The mold portion 150 is fixed to the substrate 60 such that the leg portions 152 formed so as to protrude from the main body portion 151 toward the substrate 60 separate the main body portion 151 away from the substrate 60. In this manner, in the electrical junction box 130, the main body portion 151 having the semiconductor relay housed therein is separated away from the substrate 60, and hence even when the electrical junction box 130 is used for an electric circuit through which large current flows and the semiconductor relay generates heat and increases in temperature, the transfer of the heat to the control circuit of the substrate 60 can be suppressed. Consequently, the electrical junction box 130 can prevent the heat generated by the semiconductor relay from being transferred to the control circuit.

In the electrical junction box 130, the main body portion 151 of each mold portion 150 having the semiconductor relay housed therein contacts the contact portion 162 of the heatsink 160. In this manner, when the temperature of the main body portion 151 becomes higher than that of the semiconductor relay, heat of the main body portion 151 is transferred to the heatsink 160, and the temperature of the heatsink 160 increases. When the temperature of the heatsink 160 becomes higher than that of air outside the electrical junction box 130, the heat transferred to the heatsink 160 is released from the exposed portion 161. In this manner, in the electrical junction box 130, the heat of the mold portion 150 whose temperature has been increased by the heat generated by the semiconductor relay can be released to the outside of the casing 170 through the heatsink 160. Consequently, the electrical junction box 130 can more reliably prevent the heat generated by the semiconductor relay from being transferred to the control circuit.

Note that the electrical junction boxes 1, 100, and 130 according to the above-mentioned embodiment are not limited to the above-mentioned embodiment, and various changes can be made within the scope of the claims.

In the electrical junction boxes 1, 100, and 130 described above, the substrate 60 needs to be separated away from the main body portions 51, 121, and 151 of the mold portions 50, 120, and 150 such that the control circuit of the substrate 60 is not affected when the semiconductor relay generates heat to increase the temperature thereof and the temperature of the substrate 60 increases. Thus, the lengths of the leg portions 52, 122, and 152 of the mold portions 50, 120, and 150 may be changed depending on the amount of heat generated by the semiconductor relay to adjust the distance by which the bottom wall portions 51c, 121c, and 151c are away from the substrate 60.

In the electrical junction box and the wire harness according to the present embodiment, the busbar and the semiconductor relay are disposed away from the substrate. Consequently, the electrical junction box and the wire harness exhibit an effect that heat generated by the semiconductor relay is prevented from transferring to the control circuit.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical junction box, comprising:
    a conductive input busbar;
    a conductive output busbar electrically connectable to the input busbar;
    a semiconductor relay electrically connected to the input busbar and the output busbar and configured to switch a connected state and a disconnected state of the input busbar and the output busbar;
    a substrate having mounted thereon a control circuit configured to output a control signal for controlling the semiconductor relay;
    a control terminal electrically connecting the control circuit and the semiconductor relay to each other to output the control signal to the semiconductor relay; and
    an insulating portion connected to each of the substrate, the input busbar, and the output busbar, wherein
    the semiconductor relay is mounted on at least one of the input busbar and the output busbar, and
    the input busbar, the output busbar, and the semiconductor relay are disposed away from the substrate by the insulating portion.

2. The electrical junction box according to claim 1, wherein
    the insulating portion has a main body portion covering the semiconductor relay and a portion of each of the input busbar and the output busbar, and
    the insulating portion has a leg portion provided so as to protrude from the main body portion toward the substrate, and the main body portion is separated away from the substrate by the leg portion.

3. The electrical junction box according to claim 2, further comprising:
    a casing housing therein the input busbar, the output busbar, the semiconductor relay, the substrate, the control terminal, and the insulating portion; and
    a heatsink having a contact portion that contacts the insulating portion in the casing and an exposed portion that is formed integrally with the contact portion and exposed to outside of the casing, wherein
    each of the input busbar, the output busbar, the semiconductor relay, and the insulating portion has a respective thermal conductivity and the thermal conductivity of the insulating portion is higher than the respective thermal conductivity of each of the input busbar, the output busbar, and the semiconductor relay.

4. The electrical junction box according to claim 2, wherein
    the insulating portion is molded.

5. The electrical junction box according to claim 3, wherein
    the insulating portion is molded.

6. A wire harness, comprising:
    a power supply-side electric wire to be connected to a power supply side;
    a load-side electric wire to be connected to a load side; and
    an electrical junction box comprising: a conductive input busbar electrically connected to the power supply-side electric wire; a conductive output busbar electrically connectable to the input busbar and the load-side electric wire; a semiconductor relay electrically connected to the input busbar and the output busbar and configured to switch a connected state and a disconnected state of the input busbar and the output busbar; a substrate having mounted thereon a control circuit configured to output a control signal for controlling the semiconductor relay; a control terminal electrically connecting the control circuit and the semiconductor relay to each other to output the control signal to the semiconductor relay; and an insulating portion connected to each of the substrate, the input busbar, and the output busbar, wherein
    the semiconductor relay is mounted on at least one of the input busbar and the output busbar, and
    the input busbar, the output busbar, and the semiconductor relay are disposed away from the substrate by the insulating portion.

* * * * *